US012125554B2

(12) United States Patent
Ivan et al.

(10) Patent No.: US 12,125,554 B2
(45) Date of Patent: Oct. 22, 2024

(54) SYSTEMS AND METHODS FOR RESOLVING DATA (DQ) LINE SWAPPING CONFIGURATIONS IN DOUBLE DATA RATE (DDR) MEMORIES

(71) Applicant: NXP USA, Inc., Austin, TX (US)

(72) Inventors: Radu-Marian Ivan, Bucharest (RO); Razvan Ionescu, Bucharest (RO); Maria Cristina Bucur, Bucharest (RO)

(73) Assignee: NXP USA, Inc., Austin, TX (US)

( * ) Notice: Subject to any disclaimer, the term of this patent is extended or adjusted under 35 U.S.C. 154(b) by 179 days.

(21) Appl. No.: 17/815,599

(22) Filed: Jul. 28, 2022

(65) Prior Publication Data

US 2023/0298640 A1 Sep. 21, 2023

(30) Foreign Application Priority Data

Mar. 21, 2022 (RO) .............................. a 202200139

(51) Int. Cl.
*G11C 7/00* (2006.01)
*G11C 7/10* (2006.01)

(52) U.S. Cl.
CPC .......... *G11C 7/1063* (2013.01); *G11C 7/1039* (2013.01); *G11C 7/1045* (2013.01)

(58) Field of Classification Search
CPC .... G11C 7/1063; G11C 7/1039; G11C 7/1045
USPC ....................................................... 365/191
See application file for complete search history.

(56) References Cited

U.S. PATENT DOCUMENTS

| | | | | |
|---|---|---|---|---|
| 7,299,323 B2 * | 11/2007 | Cho | ..................... | G06F 13/1668 711/155 |
| 8,626,998 B1 * | 1/2014 | Amidi | ..................... | G11C 8/12 365/230.03 |
| 9,026,725 B2 * | 5/2015 | Kostinsky | ............ | G11C 7/1063 711/167 |
| 9,037,774 B2 * | 5/2015 | Solomon | ............. | G06F 13/4243 711/147 |
| 9,123,433 B2 | 9/2015 | Hampel et al. | | |
| 9,959,914 B2 | 5/2018 | Perego et al. | | |
| 10,203,875 B1 * | 2/2019 | Ying | ..................... | G11C 29/028 |
| 10,268,608 B2 * | 4/2019 | Lee | ..................... | G11C 29/023 |
| 10,671,551 B1 | 6/2020 | Shi et al. | | |
| 11,644,987 B2 * | 5/2023 | Zhao | ..................... | G06F 13/1668 711/154 |
| 2008/0276133 A1 | 11/2008 | Hadley et al. | | |
| 2010/0005218 A1 * | 1/2010 | Gower | ............... | G06F 13/4234 711/E12.082 |

(Continued)

*Primary Examiner* — Viet Q Nguyen

(57) ABSTRACT

Systems and methods for resolving data (DQ) line swapping configuration in Double Data Rate (DDR) memories are described. In an illustrative, non-limiting embodiment, a system may include a memory controller and a memory coupled to the memory controller, the memory having program instructions stored thereon that, upon execution, cause the system to: apply a first technique to resolve DQ line swapping between a memory interface and a memory module with respect to a first subset of a plurality of DQ lines; apply a second technique different than the first technique to resolve DQ line swapping with respect to a second subset of the plurality of DQ lines; and apply a third technique different than the first and the second techniques to resolve DQ line swapping with respect to a third subset of the plurality of DQ lines.

16 Claims, 2 Drawing Sheets

(56) References Cited

U.S. PATENT DOCUMENTS

2014/0029364 A1   1/2014  Bhakta et al.
2022/0206695 A1*  6/2022  Zhao .................... G06F 3/0631

* cited by examiner

SYSTEMS AND METHODS FOR RESOLVING DATA (DQ) LINE SWAPPING CONFIGURATIONS IN DOUBLE DATA RATE (DDR) MEMORIES

CROSS-REFERENCE TO RELATED APPLICATIONS

This application claims the priority under 35 U.S.C. § 119 of Romania application no. A202200139, filed on 21 Mar. 2022, the contents of which are incorporated by reference herein.

FIELD

This disclosure relates generally to electronic circuits, and more specifically, to systems and methods for resolving data (DQ) line swapping configurations in Double Data Rate (DDR) memories.

BACKGROUND

Double Data Rate Synchronous Dynamic Random-Access Memory ("DDR SDRAM" or "DDR") is a class of memory integrated circuits (ICs) used in a wide variety of applications. Compared to its single data rate predecessor, the DDR interface has much higher transfer rates due to improved control of the timing of its electrical data and clock signals. A low-power variant of DDR, known as LPDDR, consumes less energy than DDR and is suitable for use in mobile computers and portable devices, such as tablets, mobile phones, and wearables.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

A modern Double Data Rate (DDR) memory subsystem allows data (DQ) lines to be swapped between its DDR physical layer (PHY) interface and DRAM module. The inventors hereof have recognized, however, that after DQ lines are swapped, it becomes difficult to detect their correct configuration. Moreover, the inventors have determined that wrong expectations about a memory subsystem's DQ line swapping configuration can lead to numerous problems during training (e.g., failed calibration) and runtime (e.g., incorrect timing settings or invalid runtime decision based on wrong Mode Register or "MR" bit values).

To address these, and other issues, embodiments of systems and methods for resolving DQ line swapping configurations in DDR memories are described. Modern DDR memory subsystems allow DQ pins, bits, or lines to be swapped between a DDR PHY interface and a memory module, such that a DQ pin on the PHY interface is wired to a differently numbered DQ pin on the memory module. In Integrated Circuit (IC) design, DQ swapping may be used, for example, to facilitate Printed Circuit Board (PCB) rerouting, ease congestion, etc.

Figure 1:
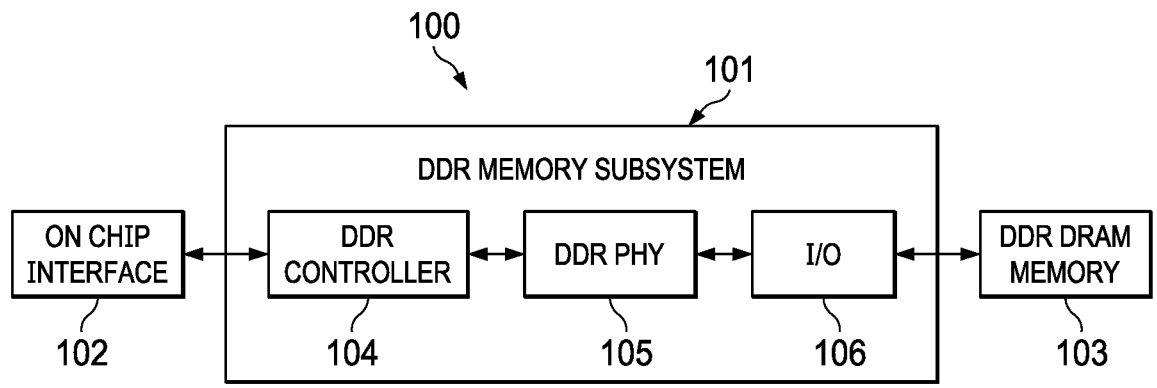
FIG. 1 is a block diagram of an example of an electronic device with a Double Data Rate (DDR) memory system, according to some embodiments.

FIG. 1 is a block diagram of electronic device 100 with DDR memory subsystem 101, according to some embodiments. As shown, DDR memory subsystem 101 is coupled to on-chip interface 102 and to DDR Dynamic Random-Access Memory (DRAM) or Synchronous DRAM (SDRAM) memory module 103. On chip-interface 102 provides an interface between memory subsystem 101 and a System-on-Chip (SoC), Application Specific Integrated Circuit (ASIC), processor, controller, or another component of electronic device 100.

In some implementations, memory subsystem 101 may be compatible with one or more memory technologies or standards, such as, for example, the Joint Electron Device Engineering Council (JEDEC)'s DDR3 (JESD79-3), DDR4 (JESD79-4), Low-Power DDR 3 or "LPDDR3" (JESD209-3B), LPDDR4 (JESD209-4), etc.

As illustrated, memory subsystem 101 includes DDR controller 104 coupled to on-chip interface 102, DDR physical interface (PHY) 105 coupled to controller 104, and input/output (I/O) circuitry 106 coupled between PHY interface 105 and memory module 103.

Controller 104 may include a logic circuit configured to manage the flow of data going to and coming from memory module 103, as well as memory refresh operations. Controller 104 may also be configured to execute program instructions for testing and initializing components of memory subsystem 101.

PHY interface 105 may implement an interface protocol that defines signals, timing, and programmable parameters required to transfer control information and data to and from memory module 103. In some cases, memory module 103 may be provided in a Dual In-Line Memory Module (DIMM) form factor.

I/O circuitry 106 may couple PHY interface 105 to memory module 103 via a memory bus. The memory bus may include command/address (CA) signals (an "address" bus) and DQ signals (a "data bus"). The address bus sends commands and instructions from controller 104 to memory module 103, whereas the data bus is used by controller 104 to write and read bit patterns onto memory module 103. These buses may be synchronized to one or more clock (CLK) signals.

In some cases, memory module 103 may be designed to operate in accordance with LPDDR4 specifications, and it may have a command/address (CA) training mode that samples CA values received via a command bus when a chip select signal is toggled and returns the sampled CA values on a data bus to controller 104. CA training allows for training of the DDR command bus and it involves programming a CA pattern, sending the CA pattern to memory module 103 via the command bus, reading the sampled values returned on the data bus, and checking for correctness (or errors).

Controller 104 may use the results of CA training, for example, to adjust a voltage reference for the command bus, to adjust relative timing between the command bus and a clock, or to configure other signaling. In various embodiments, controller 104 may also be configured to execute instructions for resolving DQ line swapping configurations.

Figure 2:
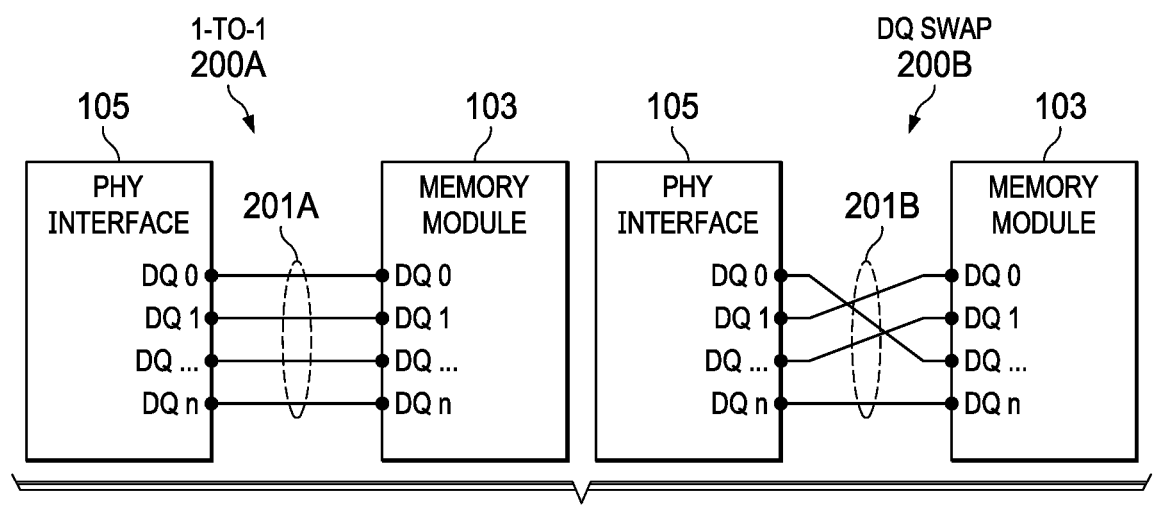
FIG. 2 is a block diagram of examples of data (DQ) line configurations in a DDR memory, according to some embodiments.

FIG. 2 is a block diagram of DQ line configurations 200A and 200B. Particularly, in configuration 200A, DQ lines, pins, or bits 1-n from PHY interface 105 are directly coupled to correspondingly numbered DQ lines, pins, or bits 1-n in memory module 103, in a 1-to-1 arrangement.

In contrast, in configuration 200B, two or more DQ lines, pins, or bits from PHY interface 105 are swapped (referred to as "DQ line swapping") such that they are coupled to a differently numbered DQ lines, pins, or bits in memory module 103. In this example, DQ line 1 in PHY interface 105 is coupled to DQ line 0 in memory module 103, DQ line 0 in PHY interface 105 is coupled to a DQ line other than DQ line 0 in memory module 103, and so on. To resolve DQ line swapping, controller 104 may determine or identify, for each given DQ line of PHY interface 105, which corresponding DQ line of memory module 103 that given DQ line is coupled to.

Figure 4:
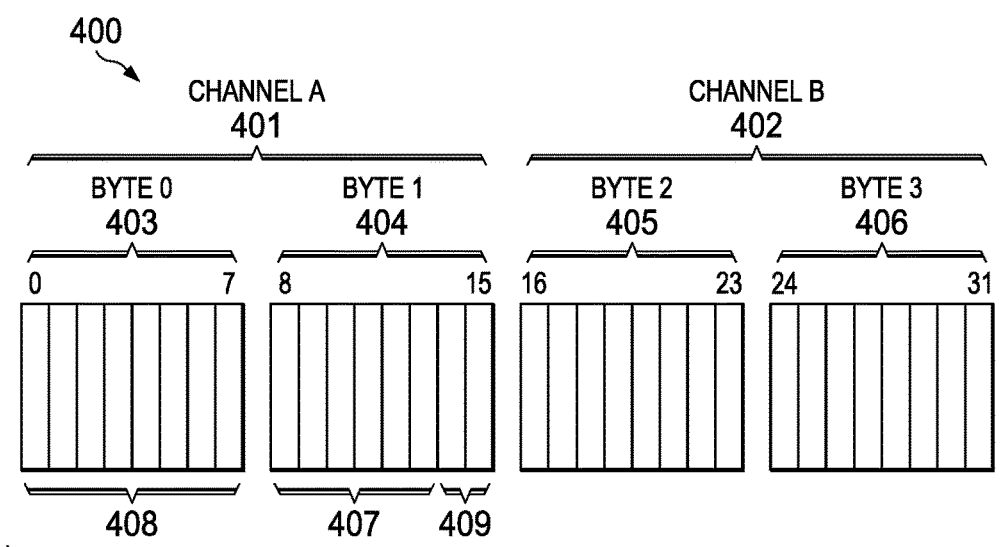
FIG. 4 is a diagram of an example of a 2-channel, 32-bit wide memory usable to illustrate operations described herein, according to some embodiments.

In various embodiments, controller 104 may be configured to resolve DQ line swapping of configuration 200B in three stages. For instance, consider a 32-bit wide data bus 400 between PHY interface 105 and memory module 103 comprising two 16-bit channels A 401 and B 402, as shown in FIG. 4. Channel A 401 comprises bytes 403 and 404, and channel B comprises bytes 405 and 406.

In a first stage, a first subset of DQ lines 407 within channel A 401 (e.g., DQ bit 8 to bit 13) may be resolved using CA training. In a second stage, a second subset of DQ lines or bits 408 within channel A 401 (e.g., DQ bit 0 to bit 7) may be resolved using Mode Register (MR) manipulation. And in a third stage, a third subset of DQ lines 409 within channel A 401 (e.g., DQ bits 14 and 15) may be resolved using DQ short circuit. Once performed for channel A 401, operations may be adjusted and performed again for channel B 402 (e.g., DQ bit 16 to bit 31).

Figure 3:
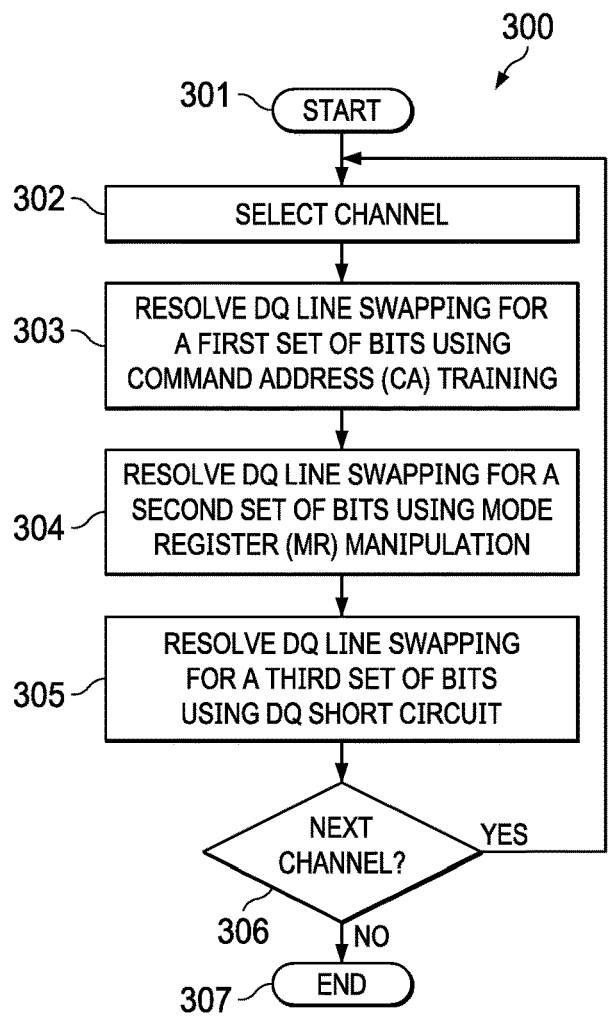
FIG. 3 is a flowchart of an example of a method for resolving DQ line swapping configurations in DDR memories, according to some embodiments.

FIG. 3 is a flowchart of method 300 for resolving DQ line swapping configurations in DDR memories. In some implementations, method 300 may be performed, at least in part, by memory controller 104. For example, method 300 may be performed as part of a test process, or as part of an initialization sequence. Particularly, method 300 begins at 301. At 302, controller 104 selects a bus channel (e.g., channel A 401 in FIG. 4).

At 303, controller 104 resolves DQ line swapping for a first set of DQ lines, pins, or bits 407 within the selected channel using a CA training technique. First, controller 104 may identify DQ line 14 or DQ line 15, which are not used to send patterns and referred to as "neutral DQ lines." Then, controller 104 may use at least one of these neutral DQ lines to purposefully cause CA training to fail, and to identify the CA address that has failed. Based on the identified CA and using a standard relationship between CA input pins and DQ output pins (a "CA-to-DQ map"), controller 104 may resolve the DQ line swap. For example, if CA 2 training fails (and CA 2 is mapped to DQ 10 in a standard CA-to-DA map), but the neutral DQ line is identified as DQ 8, controller 104 may determine that DQ line 8 is swapped with DQ line 10.

More specifically, when CA training is performed, a bit pattern is sent using CA signals and that bit pattern is feedback using DQ[8:13], where each DQ is associated with a CA following a "CA-to-DQ map" (e.g., CA 5 to DQ 13, CA 4 to DQ 12, CA 3 to DQ 11, CA 2 to DQ 10, CA 1 to DQ 9, and CA 0 to DQ 8). Ordinarily, CA training uses the received bit pattern to determine if CA settings are correct. If the received bit pattern is different from the pattern sent, additional tweaks are performed. Accordingly, at 303, method 300 uses CA training techniques to resolve DQ line swapping.

For example, based on the LPDDR4 standard, DQ lines, pins, or bits 14 and 15 are not used, so no bit pattern is fed back. By associating one of the neutral DQ lines with one active DQ line, CA training fails. To detect neutral DQ lines, controller 104 may start the training with 1x1 mapping. If the training passes, controller 104 shifts to left of the bits in byte 1, so that DQ 15 becomes DQ 8, DQ 8 becomes DQ 9, DQ 9 becomes DQ 10, DQ 10 becomes DQ 11, DQ 11 becomes DQ 12, DQ 12 becomes DQ 13, DQ 13 becomes DQ 14, and DQ 14 becomes DQ 15.

Controller 104 repeats the shifting process until it receives a CA training fail, which identifies the neutral DQ line(s) because only a non-active line fails. Based on failure logs, controller 104 may identify the CA signal fail, and, using the CA-to-DQ map, it may resolve the position of neutral DQ line against the failing associated position. For example, if CA3 is reported to have failed—which has DQ 11 associated—but the neutral DQ line is in position DQ 8, then controller 104 may conclude that there is a PCB level swap between DQ line 8 and DQ line 11. The process may be repeated within block 302 for all remaining DQ lines in range (e.g., [8:13]).

At 304, controller 104 resolves DQ line swapping for a second set of DQ lines or bits 408 within the selected channel using a MR manipulation technique. Generally, MR registers are used to select a specific mode of operation of memory module 103. In this case, controller 104 first identifies an MR that accepts read and write (e.g., MR 12 for LPDDR4). Then, assuming a 1-to-1 direct mapping of configuration 200A, controller 104 uses the identified MR to write a bit pattern that sets each bit at a time (e.g., 0x1 (0000 0001), 0x2 (0000 0010), etc.). Based upon a comparison between the written bit patterns and the read bit patterns, controller 104 may resolve the DQ line swapping for each bit.

For example, if the position of the bit set in the bit pattern to be written indicates the position of the PHY interface 105's DQ line, the bit set in the bit pattern ultimately read shows the corresponding DQ line of memory module 103. If controller 104 writes 0000 0001 and reads 0000 0001, controller 104 may determine that DQ 0 is not swapped. If it reads 0000 0010, controller 104 may determine that DQ 0 is swapped with DQ 1. If it reads 0000 0100, controller 104 may determine that DQ 0 is swapped with DQ 2. If it reads 0000 1000, controller 104 may determine that DQ 0 is swapped with DQ 3. If it reads 0001 0000, controller 104 may determine that DQ 0 is swapped with DQ 4. If it reads 0010 0000, controller 104 may determine that DQ 0 is swapped with DQ 5. If it reads 0100 0000, controller 104 may determine that DQ 0 is swapped with DQ 6. And if it reads 1000 0000, controller 104 may determine that DQ 0 is swapped with DQ 7. Controller 104 may then repeat the process for all bits in range (e.g., [0:7]).

At 305, controller 104 may resolve DQ line swapping for a third set of DQ lines, pins, or bits 409 within the selected channel using a DQ short circuit technique. First, controller 104 may identify an already resolved DQ line (e.g., [8:13]) in the same byte, and it may map the resolved DQ line to a given one of the third set of DQ lines 14 or 15.

For example, controller 104 may use DQ line 11 for position 11 but also for position 15 (i.e., short circuited), such that DQ 11 becomes DQ 11 duplicated onto DQ 15. Controller 104 may configure and initialize memory module 103, and it may write a bit pattern that sets only the bit of the previously identified DQ line (e.g., DQ 11→0x0800 or 0000 1000 0000 0000).

Then, controller 104 may read the same memory module 103 and check the positions of bits set to 1: if DQ 15 is not swapped with DQ 14, the value read will be 0x8800 or 1000 1000 0000 0000, but if DQ 15 is swapped with DQ 14, the value read will be 0x4800 or 0100 1000 0000 0000. Accordingly, controller 104 may determine whether DQ 14 is switched with DQ 15 based upon this value.

At 306, method 300 determines whether there is another channel to be resolved. If not, method 300 ends at 307. Otherwise, controller 104 returns to block 302 and the next channel is selected. During performance of method 300 with respect to channel B 402, at 303, controller 104 may use a +16-bit mapping adjustment for CA training analysis (e.g., CA 5 to DQ 29, CA 4 to DQ 28, CA 3 to DQ 27, CA 2 to DQ 26, CA 1 to DQ 25, and CA 0 to DQ 24).

At 304, during performance of method 300 with respect to channel B 402, controller 104 may use the MR associated to channel B (second die). Each channel may be associated with a die, and each die may have its own MR registers. When the read and write for MRs are performed, controller 104 may specify the second die as the target.

At 305, during performance of method 300 with respect to channel B 402, controller 104 may use a bit pattern that touches bit 27 (e.g., 0x0800 0000). The read values would be 0x8800 0000 if DQ 31 is on correct position. If not, the alternative value would be 0x4800 0000, which means that DQ 31 is swapped with DQ 30.

As such, systems and methods described herein may be employed to resolve data DQ line swapping configurations in DDR memories. These systems and methods may reduce bring-up time, for example, when a customer performs a set of tests on their custom boards before manufacturing large quantities of PCBs (incorrect DQ line swap configuration causes DDR testing problems). In some implementations, these systems and methods may be used to provide PCB design guidance, for example, via a Graphical User Interface (GUI) feature that checks bit order constrains using circuit schematics to prevent unusable PCB designs.

In an illustrative, non-limiting embodiment, a system may include a memory controller and a memory coupled to the memory controller, the memory having program instructions stored thereon that, upon execution, cause the system to: apply a first technique to resolve DQ line swapping between a memory interface and a memory module with respect to a first subset of a plurality of DQ lines, apply a second technique different than the first technique to resolve DQ line swapping with respect to a second subset of the plurality of DQ lines, and apply a third technique different than the first and the second techniques to resolve DQ line swapping with respect to a third subset of the plurality of DQ lines. The memory interface may include a DDR PHY interface and the memory module may include a DRAM module.

The first technique may include a CA training technique. To apply the CA training technique, the program instructions, upon execution, may cause the system to: map one of the first subset of DQ lines to a neutral DQ line, receive an indication of a CA training failure for the mapped DQ line, and resolve the DQ line swapping, at least in part, based upon a comparison between the CA training failure and a CA-to-DQ map. The plurality of DQ lines may correspond to a 16-bit channel, the first subset of DQ lines may correspond to bits 8 through 13, and the neutral DQ line may correspond to at least one of bits 14 or 15.

The second technique may include an MR manipulation technique. To apply the MR manipulation technique, the program instructions, upon execution, may cause the system to: write a first bit pattern to the memory module, where the first data pattern sets only a single bit, read a second bit pattern stored in the memory module, where the second bit pattern sets a different bit, and resolve the DQ line swapping, at least in part, based upon a comparison between a position of the single bit and a position of the different bit. The plurality of DQ lines may correspond to a 16-bit channel and the second subset of DQ lines may correspond to bits 0 through 7.

The third technique may include a short circuit technique. To apply the short circuit technique, the program instructions, upon execution, may cause the system to: duplicate a resolved DQ line onto an expected neutral DQ line, write a bit pattern to the memory module, where the bit pattern sets a single bit corresponding to the resolved DQ line, read the bit pattern, and resolve the DQ line swapping, at least in part, in response to more than one bit set in the read bit pattern. The plurality of DQ lines may correspond to a 16-bit channel and the third subset of DQ lines may correspond to bits 14 and 15.

In another illustrative, non-limiting embodiment, a method may include: communicating with a memory module via a memory interface using a plurality of DQ lines, and at least partially resolving DQ line swapping between the memory module and the memory interface for a first subset of the plurality of DQ lines using CA training. For example, the method may include: mapping at least one of the first subset of DQ lines to a neutral DQ line, receiving an indication of a CA training failure for the mapped DQ line, and resolving the DQ line swapping, at least in part, based upon a comparison between the CA training failure and a CA-to-DQ map.

The method may also include at least partially resolving the DQ line swapping for a second subset of the plurality of DQ lines using MR manipulation. For example, the method may include: writing a first bit pattern to the memory module using the second subset of DQ lines, where the first bit pattern sets a selected bit, reading the first bit pattern as stored in the memory module, where the stored bit pattern has a different bit set, and at least partially resolving the DQ line swapping based upon a comparison between a position of the selected bit and a position of the different bit.

The method may further include at least partially resolving the DQ line swapping for a third subset of the plurality of DQ lines using a short circuit configuration. For example, the method may include: writing a bit pattern to the memory module that sets only a bit corresponding to a resolved DQ line, where the resolved DQ line is duplicated onto a neutral DQ line, and at least partially resolving the DQ line swapping based upon more than one bit being set in a reading of the bit pattern.

In yet another illustrative, non-limiting embodiment, an electronic device may include: a chip, a memory controller coupled to the chip, and a memory module coupled to the memory controller via a memory interface, wherein the memory controller is configured to execute program instructions that cause the electronic device to apply CA training to resolve DQ line swapping between the memory interface and the memory module with respect to a first set of DQ lines.

The memory controller may also be configured to execute program instructions that cause the electronic device to apply MR manipulation to resolve DQ line swapping between the memory interface and the memory module with respect to a second set of DQ lines. The memory controller may be further configured to execute program instructions that cause the electronic device to use a short circuit configuration to resolve DQ line swapping between the memory interface and the memory module with respect to a third set of DQ lines.

To implement various operations described herein, computer program code (i.e., instructions for carrying out these operations) may be written in any combination of one or more programming languages, including an object-oriented programming language such as Java, Smalltalk, Python, C++, or the like, conventional procedural programming languages, such as the "C" programming language or similar programming languages, or any of machine learning software. These program instructions may also be stored in a computer readable storage medium that can direct a computer system, other programmable data processing apparatus, controller, or other device to operate in a particular manner, such that the instructions stored in the computer readable medium produce an article of manufacture including instructions which implement the operations specified in the block diagram block or blocks. The program instructions may also be loaded onto a computer, other programmable data processing apparatus, controller, or other device to cause a series of operations to be performed on the computer, or other programmable apparatus or devices, to produce a computer implemented process such that the instructions upon execution provide processes for implementing the operations specified in the block diagram block or blocks.

Modules implemented in software for execution by various types of processors may, for instance, include one or more physical or logical blocks of computer instructions, which may, for instance, be organized as an object or procedure. Nevertheless, the executables of an identified module need not be physically located together but may include disparate instructions stored in different locations which, when joined logically together, include the module and achieve the stated purpose for the module. Indeed, a module of executable code may be a single instruction, or many instructions, and may even be distributed over several different code segments, among different programs, and across several memory devices. Similarly, operational data may be identified and illustrated herein within modules and may be embodied in any suitable form and organized within any suitable type of data structure. The operational data may be collected as a single data set or may be distributed over different locations including over different storage devices.

In many implementations, systems and methods described herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, wearable devices, IoT devices, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Although the invention(s) is/are described herein with reference to specific embodiments, various modifications and changes can be made without departing from the scope of the present invention(s), as set forth in the claims below.

Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Reference is made herein to "configuring" a device or a device "configured to" perform some operation(s). It should be understood that this may include selecting predefined logic blocks and logically associating them. It may also include programming computer software-based logic of a retrofit control device, wiring discrete hardware components, or a combination of thereof. Such configured devices are physically designed to perform the specified operation(s).

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A system, comprising:
   a memory controller; and
   a memory coupled to the memory controller, the memory having program instructions stored thereon that, upon execution, cause the system to:
   apply a first technique to resolve data (DQ) line swapping between a memory interface and a memory module with respect to a first subset of a plurality of DQ lines;
   apply a second technique different than the first technique to resolve DQ line swapping with respect to a second subset of the plurality of DQ lines; and
   apply a third technique different than the first and the second techniques to resolve DQ line swapping with respect to a third subset of the plurality of DQ lines.

2. The system of claim 1, wherein the memory interface comprises a Double Data Rate (DDR) physical layer (PHY) interface, and wherein the memory module comprises a Dynamic Random-Access Memory (DRAM) module.

3. The system of claim 2, wherein the first technique comprises a command/address (CA) training technique.

4. The system of claim 3, wherein to apply the CA training technique, the program instructions, upon execution, further cause the system to:
   map one of the first subset of DQ lines to a neutral DQ line;
   receive an indication of a CA training failure for the mapped DQ line; and resolve the DQ line swapping, at least in part, based upon a comparison between the CA training failure and a CA-to-DQ map.

5. The system of claim 3, wherein the plurality of DQ lines corresponds to a 16-bit channel, wherein the first subset of DQ lines corresponds to bits 8 through 13, and wherein the neutral DQ line corresponds to at least one of bits 14 or 15.

6. The system of claim 1, wherein the second technique comprises a Mode Register (MR) manipulation technique.

7. The system of claim 6, wherein to apply the MR manipulation technique, the program instructions, upon execution, further cause the system to:
write a first bit pattern to the memory module, wherein the first data pattern sets only a single bit;
read a second bit pattern stored in the memory module, wherein the second bit pattern sets a different bit; and
resolve the DQ line swapping, at least in part, based upon a comparison between a position of the single bit and a position of the different bit.

8. The system of claim 6, wherein the plurality of DQ lines corresponds to a 16-bit channel, and wherein the second subset of DQ lines corresponds to bits 0 through 7.

9. The system of claim 1, wherein the third technique comprises a short circuit technique.

10. The system of claim 9, wherein to apply the short circuit technique, the program instructions, upon execution, further cause the system to:
duplicate a resolved DQ line onto an expected neutral DQ line;
write a bit pattern to the memory module, wherein the bit pattern sets a single bit corresponding to the resolved DQ line;
read the bit pattern; and
resolve the DQ line swapping, at least in part, in response to more than one bit set in the read bit pattern.

11. The system of claim 9, wherein the plurality of DQ lines corresponds to a 16-bit channel, and wherein the third subset of DQ lines correspond to bits 14 and 15.

12. A method, comprising:
communicating with a memory module via a memory interface using a plurality of data (DQ) lines; and
at least partially resolving DQ line swapping between the memory module and the memory interface for a first subset of the plurality of DQ lines using command/address (CA) training, wherein the at least partially resolving DQ line swapping between the memory module and the memory interface comprises:
mapping at least one of the first subset of DQ lines to a neutral DQ line;
receiving an indication of a CA training failure for the mapped DQ line; and
resolving the DQ line swapping, at least in part, based upon a comparison between the CA training failure and a CA-to-DQ map.

13. A method, comprising:
communicating with a memory module via a memory interface using a plurality of data (DQ) lines;
at least partially resolving DQ line swapping between the memory module and the memory interface for a first subset of the plurality of DQ lines using command/address (CA) training; and
at least partially resolving the DQ line swapping for a second subset of the plurality of DQ lines using Mode Register (MR) manipulation, wherein the at least partially resolving the DQ line swapping for the second subset comprises:
writing a first bit pattern to the memory module using the second subset of DQ lines, wherein the first bit pattern sets a selected bit;
reading the first bit pattern as stored in the memory module, wherein the stored bit pattern has a different bit set; and
at least partially resolving the DQ line swapping based upon a comparison between a position of the selected bit and a position of the different bit.

14. A method, comprising:
communicating with a memory module via a memory interface using a plurality of data (DQ) lines;
at least partially resolving DQ line swapping between the memory module and the memory interface for a first subset of the plurality of DQ lines using command/address (CA) training;
at least partially resolving the DQ line swapping for a second subset of the plurality of DQ lines using Mode Register (MR) manipulation; and
at least partially resolving the DQ line swapping for a third subset of the plurality of DQ lines using a short circuit configuration.

15. The method of claim 14, further comprising:
writing a bit pattern to the memory module that sets only a bit corresponding to a resolved DQ line, wherein the resolved DQ line is duplicated onto a neutral DQ line; and
at least partially resolving the DQ line swapping based upon more than one bit being set in a reading of the bit pattern.

16. An electronic device, comprising:
a chip;
a memory controller coupled to the chip; and
a memory module coupled to the memory controller via a memory interface, wherein the memory controller is configured to execute program instructions that cause the electronic device to:
apply command/address (CA) training to resolve data (DQ) line swapping between the memory interface and the memory module with respect to a first set of DQ lines,
apply Mode Register (MR) manipulation to resolve DQ line swapping between the memory interface and the memory module with respect to a second set of DQ lines, and
use a short circuit configuration to resolve DQ line swapping between the memory interface and the memory module with respect to a third set of DQ lines.

* * * * *